(12) United States Patent
Bal et al.

(10) Patent No.: US 12,500,592 B2
(45) Date of Patent: Dec. 16, 2025

(54) DEVICE AND METHOD FOR TIME SKEW CALIBRATION OF MULTI CHANNEL ADC

(71) Applicant: STMicroelectronics International N.V., Geneva (CH)

(72) Inventors: Ankur Bal, Greater Noida (IN); Jeet Narayan Tiwari, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 224 days.

(21) Appl. No.: 18/363,582

(22) Filed: Aug. 1, 2023

(65) Prior Publication Data

US 2024/0056091 A1 Feb. 15, 2024

Related U.S. Application Data

(60) Provisional application No. 63/371,046, filed on Aug. 10, 2022.

(51) Int. Cl.
*H03M 1/00* (2006.01)
*H03M 1/06* (2006.01)
(Continued)

(52) U.S. Cl.
CPC ....... *H03M 1/0626* (2013.01); *H03M 1/1071* (2013.01); *H03M 1/1255* (2013.01)

(58) Field of Classification Search
CPC ............ H03M 1/1215; H03M 1/0836; H03M 1/0624; H03M 1/0626; H03M 1/12; H03M 1/1033; H03M 1/1245; H03M 1/121; H03M 1/1023; H03M 1/1028; H03M 1/00; H03M 1/1255; H03M 1/0609; H03M 1/1004; H03M 1/1009; H03M 1/1014; H03M 1/1225; H03M 1/123; H03M 1/38; H03M 1/002; H03M 1/06; H03M 1/0604; H03M 1/0607; H03M 1/0612; H03M 1/0614; H03M 1/0617; H03M 1/0634; H03M 1/0673; H03M 1/0695; H03M 1/08; H03M 1/10; H03M 1/1019; H03M 1/1057; H03M 1/1061; H03M 1/1071; H03M 1/1235; H03M 1/181; H03M 1/183; H03M 1/363;
(Continued)

(56) References Cited

U.S. PATENT DOCUMENTS 6,930,625 B1 8/2005 Lin
7,016,421 B2 3/2006 Yap et al.
(Continued)

OTHER PUBLICATIONS

Beydoun et al., "A Novel Digital Calibration Technique for Gain and Offset Mismatch in Parallel TI Sigma Delta ADCs," International Conference on Acoustics, Speech, and Signal Processing, 5 pages, Apr. 2010.
(Continued)

*Primary Examiner* — Linh V Nguyen
(74) *Attorney, Agent, or Firm* — Seed Intellectual Property Law Group LLP

(57) ABSTRACT

An integrated circuit includes a plurality of ADC channels. During a calibration process of the ADC channels, the integrated circuit utilizes derivative filters to calculate a phase difference between the ADC channels. During a calibration process, the integrated circuit utilizes clock phase alignment circuits to align the phases of the ADC channels based on the outputs of the derivative filters.

20 Claims, 7 Drawing Sheets

(51) Int. Cl.
*H03M 1/10* (2006.01)
*H03M 1/12* (2006.01)

(58) Field of Classification Search
CPC .......... H03M 1/46; H03M 1/466; H03M 1/60; H03M 1/804; H03M 3/322; H03M 3/344; H03M 3/346; H03M 3/35; H03M 3/37; H03M 3/466
USPC .................................. 341/118–120, 141, 155
See application file for complete search history.

(56) References Cited

U.S. PATENT DOCUMENTS

| | | | | |
|---|---|---|---|---|
| 9,209,825 | B1* | 12/2015 | Visani | H03M 1/0626 |
| 9,553,600 | B1* | 1/2017 | Lacroix | H03M 1/0624 |
| 9,584,145 | B1* | 2/2017 | Shin | H03M 1/1028 |
| 9,596,035 | B2* | 3/2017 | Oveis Gharan | H04B 10/6165 |
| 10,804,919 | B1* | 10/2020 | Cranford | H03M 1/1061 |
| 2006/0250288 | A1* | 11/2006 | Fernandez | H03M 1/10 |
| | | | | 341/120 |
| 2012/0213531 | A1 | 8/2012 | Nazarathy et al. | |
| 2013/0137938 | A1* | 5/2013 | Peters | A61B 5/7225 |
| | | | | 600/301 |
| 2016/0020781 | A1* | 1/2016 | Baringer | H03M 3/46 |
| | | | | 341/110 |
| 2016/0079994 | A1* | 3/2016 | Lee | H03M 1/46 |
| | | | | 341/118 |
| 2016/0182074 | A1 | 6/2016 | Speir et al. | |
| 2016/0308665 | A1* | 10/2016 | Luo | H03F 3/45475 |
| 2017/0026052 | A1* | 1/2017 | Le Dortz | H03M 1/1215 |
| 2017/0117914 | A1* | 4/2017 | Choi | H03M 1/1033 |
| 2017/0187401 | A1 | 6/2017 | Talty et al. | |
| 2019/0173480 | A1* | 6/2019 | Ryu | H03M 1/0624 |
| 2019/0238149 | A1* | 8/2019 | Dyer | H03M 1/0673 |
| 2021/0159908 | A1* | 5/2021 | Singh | H03M 1/0626 |
| 2023/0155598 | A1* | 5/2023 | Lok | H03M 1/1014 |
| | | | | 341/120 |

OTHER PUBLICATIONS

Maxim Integrated, Datasheet: MAX11040K/MAX11060, 24-/16-Bit, 4-Channel, Simultaneous-Sampling, Cascadable, Sigma-Delta ADCs, 19-5741, Rev. 4, 35 pages, May 2015.

* cited by examiner

DEVICE AND METHOD FOR TIME SKEW CALIBRATION OF MULTI CHANNEL ADC

BACKGROUND

Technical Field

The present disclosure is related to integrated circuits, and more particularly, to analog-to-digital converters (ADC).

Description of the Related Art

Integrated circuits are utilized for a large variety of applications. In many applications it is desirable to convert analog signals to digital signals. For this purpose, integrated circuits may include an ADC. Some integrated circuits may receive analog signals from multiple external sources. Each ADC may convert the analog signal from one of the external sources to a digital signal. It can be difficult to ensure that the outputs of the ADCs are suitably synchronized.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide an integrated circuit that includes a plurality of ADC channels that each receive an analog signal from a respective source. Embodiments of the present disclosure are able to quickly and efficiently calibrate the ADC channels to reduce latency between the various ADC channels. The integrated circuit includes a plurality of phase detection circuits and clock phase adjustment circuits. The phase detection circuits detect phase differences between the outputs of the ADC channels. The clock phase adjustment circuit adjusts the phase of the clock signal provided to each ADC channel to reduce latency between the ADC channels. This helps ensure that the integrated circuit can process the signals from the various external sources in a coherent manner.

In one embodiment, each ADC channel is a sigma delta ADC (SDADC). Each ADC receives a clock signal and converts the analog signals to digital signals in accordance with the clock signal. During a calibration process, a test signal generator provides a test signal to each ADC in parallel. One ADC channel is utilized as a reference channel. Each phase detection circuit detects the phase difference between one of the ADC channels and the reference channel. The clock phase adjustment circuit then adjusts the phase of the clock circuit provided to each ADC channel based on the phase difference between the ADC channel and the reference ADC channel.

In one embodiment, each phase detection circuit includes one or more derivative filters. Each phase detection circuit receives the output test signal from one of the ADC channels and the reference output test signal. The one or more derivative filters output derivative (slope) values associated with the output test signal. The phase detection circuit generates a phase difference signal based on the difference between the derivative of the output test signal and the reference test signal. The clock adjustment circuit then adjusts the clock signal provided to the ADC channel based on the output of the phase detection circuit.

In one embodiment, an integrated circuit includes a first analog-to-digital converter channel having an input and an output, a second analog-to-digital converter channel having an input and an output, and a derivative filter. The derivative filter includes a first input coupled to the output of the first analog-to-digital converter channel, a second input coupled to the output of the second analog-to-digital converter channel, an output.

In one embodiment, a method includes generating, with a first analog-to-digital converter channel of an integrated circuit, a first output signal and generating, with a second analog-to-digital converter channel of the integrated circuit, a second output signal. The method includes generating, with a derivative filter, a control signal based on a phase difference between the first output signal and the second output signal and generating an adjusted clock signal by adjusting a phase of a clock signal based on the control signal.

In one embodiment, a method includes providing an analog test signal to a first analog-to-digital converter channel of an integrated circuit and to a plurality of second analog-to-digital converter channels of the integrated circuit, generating, with the first analog-to-digital converter channel, a first output signal based on the analog test signal, and generating, with each second analog-to-digital converter channel, a respective second output signal based on the analog test signal. The method includes receiving, with a plurality of derivative filters each coupled to a respective second analog-to-digital converter channel of the plurality of second analog-to-digital converter channels, the first output signal and receiving, with each derivative filter, the second output signal of the second analog-to-digital converter coupled to the derivative filter.

In one embodiment, an integrated circuit includes a first analog-to-digital converter channel having an input and an output, a second analog-to-digital converter channel having an input and an output, and a third analog-to-digital converter channel having an input and an output. The integrated circuit includes a first derivative filter having a first input coupled to the output of the first analog-to-digital converter channel, a second input coupled to the output of the second analog-to-digital converter channel, and an output. The integrated circuit includes a second derivative filter having a first input coupled to the output of the first analog-to-digital converter channel, a second input coupled to the output of the third analog-to-digital converter channel, and an output.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
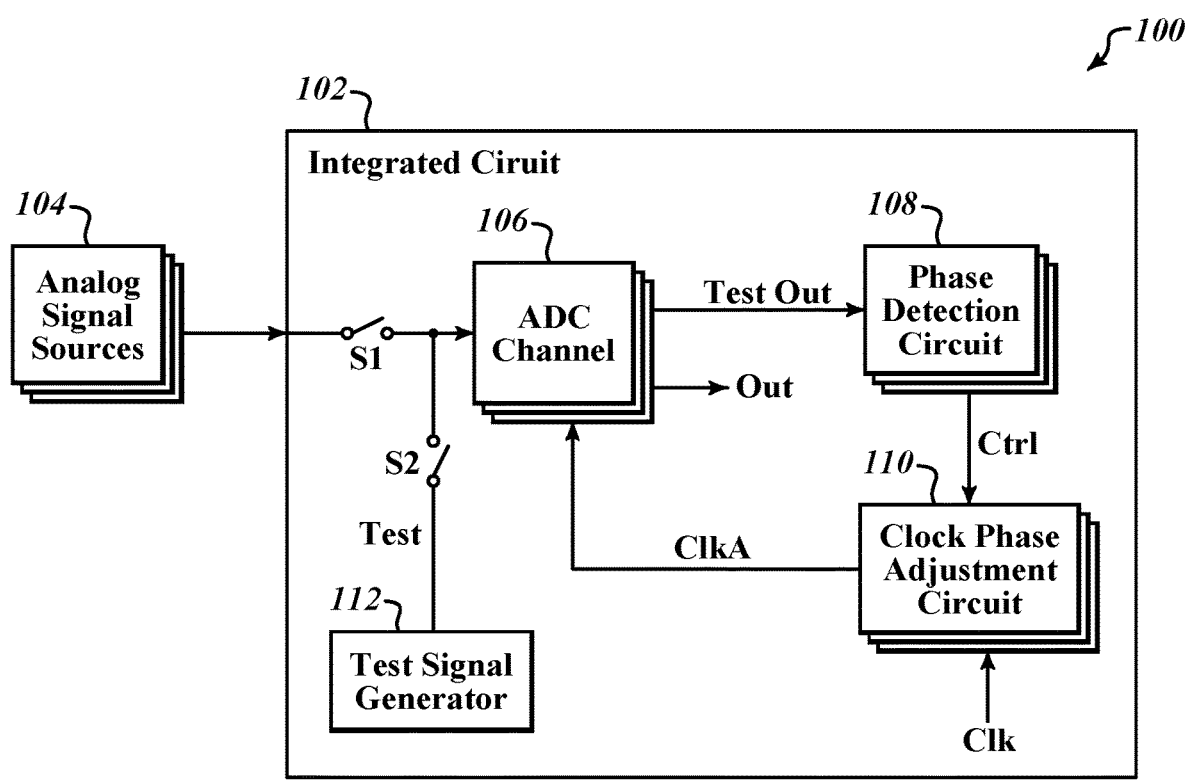
FIG. 1 is a block diagram of an integrated circuit, according to one embodiment.

FIG. 1 is a block diagram of a system 100, in accordance with some embodiments. The system 100 includes an integrated circuit 102 and a plurality of analog signal sources 104. As will be set forth in more detail below, the components of the integrated circuit 102 cooperate to enable processing of signals from the analog signal sources 104.

In one embodiment, the analog signal sources 104 include an array of antennas. In other words, each analog signal source 104 is an antenna. Each antenna outputs an analog signal. Each antenna has a particular position and orientation. Each antenna may receive signals and generate corresponding analog signals that are passed to the integrated circuit 102.

The integrated circuit 102 includes a plurality of ADC channels 106. Each ADC channel 106 is coupled to a respective analog signal source 104. The integrated circuit 102 may include a plurality of I/O terminals each coupled to one of the analog signal sources 104. Each ADC channel 106 may be coupled to a respective I/O terminal and may receive analog signals from the corresponding I/O terminal.

Each ADC channel 106 may correspond to an individual ADC. Alternatively, the ADC channels 106 may collectively correspond to an individual ADC. In any case, each ADC channel 106 receives analog signals from one of the analog signals sources 104 and converts the analog signals to digital signals.

In one embodiment, each ADC channel 106 is an SDADC channel. Each ADC channel 106 may include an SD modulator and a digital processor. The SD modulator and the digital processor may collectively correspond to the SDADC channel. Other types of ADC channels 106 can be utilized without departing from the scope of the present disclosure.

The integrated circuit 102 may include circuitry for analyzing the signals provided by the analog signal sources 104. The circuitry may generate an overall signal based on all of the signals from the analog signal sources 104. In this case, if there are timing mismatches between the ADC channels 106, then the overall signal may not provide an accurate representation of the signals output from the analog signal sources 104 at any given time.

It is possible that there may be phase mismatches between the outputs ADC channels 106. One potential source of mismatches is delay or skew in the clock signals provided to the ADC channels 106. The integrated circuit 102 may include a clock signal generator that provides a clock signal to each ADC channel 106. There may be differences in signal path lengths between the clock circuit and each ADC channel 106. Additionally, there may be temperature, voltage, and process variations that result in phase mismatches in the clock signal received at the various ADC channels 106. These and other factors may result in the clock signal arriving at each ADC channel 106 at a different phase of the clock signal. This in turn causes phase differences in the outputs of each ADC channel 106. If such phase differences are large, then the integrated circuit 102 may not be able to accurately analyze the analog signals from each of the analog signal sources 104.

The integrated circuit 102 includes circuitry that helps to calibrate the ADC channels 106 to remove or reduce any timing mismatches between the ADC channels 106. In particular, the integrated circuit 102 includes a test signal generator 112. The integrated circuit 102 includes switches S1 that can selectively connect and disconnect the analog signal sources 104 from the ADC channels 106. The integrated circuit 102 includes one or more switches S2 that can selectively couple the test signal generator 112 to the inputs of the ADC channels 106. During a calibration operation of the integrated circuit 102, the analog signal sources 104 are disconnected by opening the switches S1. During the calibration operation of the integrated circuit 102, the test signal generator 112 is coupled to each of the inputs of the ADCs 106 by closing the one or more switches S2.

During the calibration operation, the test signal generator 112 generates an input test signal. The test signal generator 112 provides the test signal to the input of each of the ADC channels 106 such that all of the ADC channels 106 receive the input test signal in phase. The input test signal can include a square wave, a sine wave, or other types of input test signals.

During the calibration process, each ADC channel 106 generates an output test signal from the input test signal. As described previously, each ADC channel 106 is controlled by clock signal received from a clock generator. Each ADC channel 106 generates the output test signal from the input test signal in conjunction with the clock signal. If there are phase mismatches in the clock signal received by each ADC channel 106, the output test signals will also have corresponding phase mismatches.

The integrated circuit 102 includes a plurality of phase detection circuits 108. In one embodiment, if there are N ADC channels 106, then there are N−1 phase detection circuits 108. One of the ADC channels may be designated as a primary or reference ADC channel 106 for calibration purposes. The other ADC channels 106 may be designated as secondary channels for calibration purposes. There is a respective phase detection circuit 108 for each secondary ADC channel.

In one embodiment, each phase detection circuit 108 receives the output test signal from the reference or primary ADC channel 106 and from the secondary ADC channel to which the phase detection circuit 108 is coupled. Accordingly, each phase detection circuit 108 receives the output test signal from the reference ADC channel and the output test signal from one of the secondary ADC channels.

In one embodiment, each phase detection circuit 108 generates a phase signal Ctrl. The phase signal Ctrl indicates a phase difference between the reference ADC channel in the corresponding secondary ADC channel. The phase signal may also be termed a phase correction signal. The phase correction signal may indicate an action to be taken to correct or reduce the phase difference.

In one embodiment, the integrated circuit includes a plurality of clock phase adjustment circuits 110. Each clock phase adjustment circuit 110 is coupled to a respective phase detection circuit 108 and to the corresponding secondary ADC channel 106. Each clock phase adjustment circuit 110 receives the clock signal CLK and provides the clock signal CLKA the corresponding ADC channel 106. The clock phase adjustment circuit 106 receives the phase signal Ctrl from the corresponding phase detection circuit 108. The clock phase adjustment circuit 110 generates an adjusted clock signal CLKA by adjusting the phase of the clock signal CLK based on the phase signal. In particular, the clock phase adjustment circuit 110 adjusts the phase of the clock signal CLK so that the output of the corresponding secondary ADC channel is aligned with the reference ADC channel. Because there is a clock phase adjustment circuit 110 for each secondary ADC channel, the phase of each secondary ADC channel 106 is brought into alignment with the phase of the reference ADC channel 106 by adjusting the clock signal CLK. This results phase alignment of each of the ADC channels.

The clock phase adjustment circuit 110 may initially introduce a same default amount of delay into the clock signal CLK. Each clock phase adjustment circuit 110 can then increase or decrease the amount of delay in order to align the phase of the corresponding secondary ADC channel with the phase of the reference ADC channel, based on the phase signal provided by the corresponding phase detection circuit 108. The initial delay value provides flexibility to the clock phase adjustment circuit 110 to either decrease or increase the amount of added delay rather than being only able to add delay.

Figure 2A:
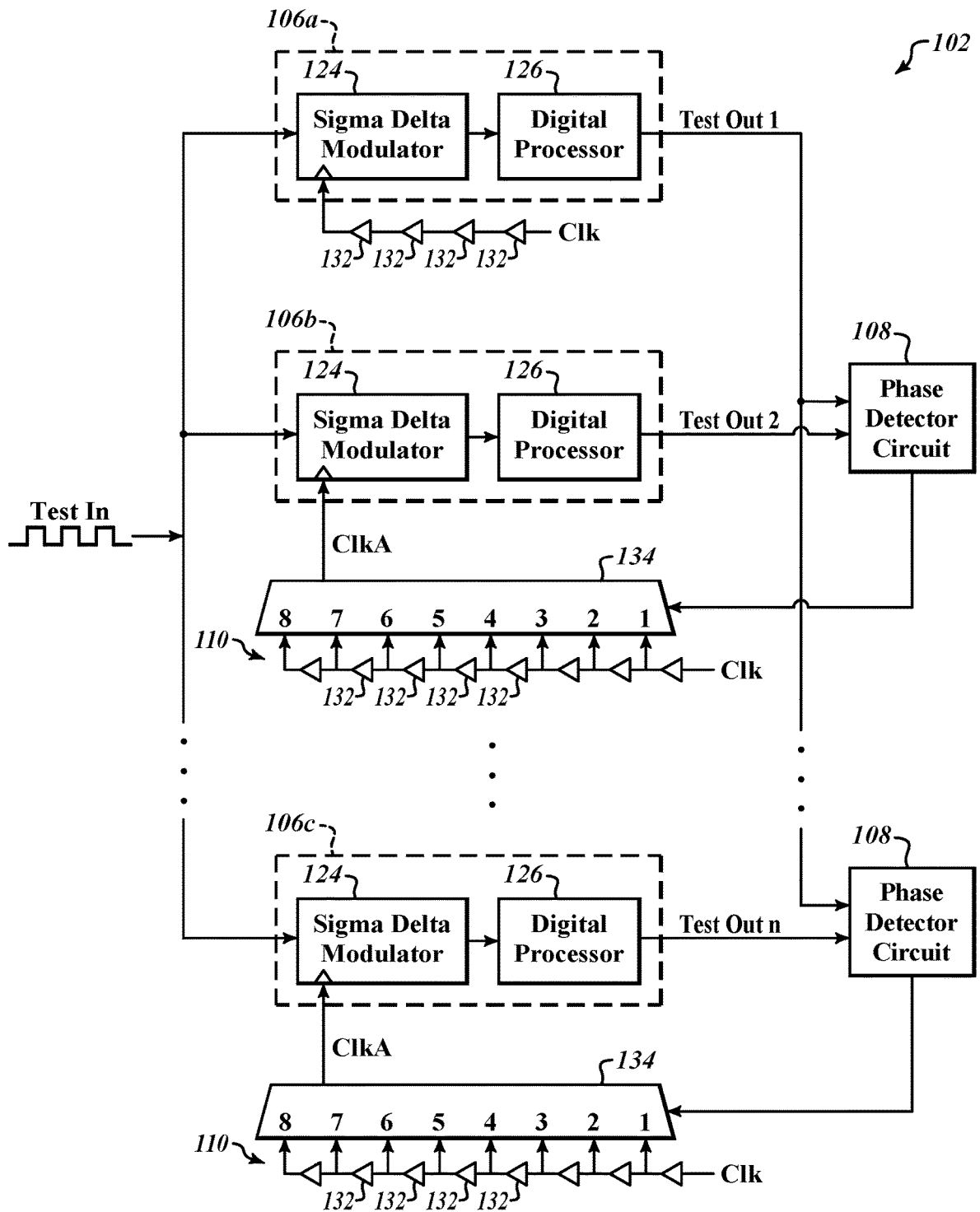
FIG. 2A is a block diagram of an integrated circuit according to one embodiment.

FIG. 2A is a block diagram of an integrated circuit 102, in accordance with some embodiments. The integrated circuit 102 of FIG. 2 is one example of the integrated circuit 102 of FIG. 1. The integrated circuit includes a plurality of ADC channels 106a-c. While FIG. 2A illustrates three ADC channels 106, in practice, there may be more than three ADC channels.

Each ADC channel 106 includes an SD modulator 124 and the digital processor 126. The SD modulator 124 may correspond to a continuous time SD modulator. Each SD modulator 124 may include an accumulator having a first input coupled to the input of the ADC channel 106, a low-pass filter coupled to the output of the accumulator, a quantizer coupled to the output of low-pass filter by a switch, and a digital-to-analog converter (DAC) having an input coupled to the output of the quantizer and an output coupled to a second input of the accumulator. The accumulator may subtract the output of the DAC from the input signal. The switch between the filter and quantizer is opened and closed in accordance with the clock signal CLK. The output of the quantizer is a digital signal. The output of the quantizer corresponds to the output of the SD modulator 124. The DAC corresponds to a feedback mechanism between the output of the SD modulator 124 and the input of the SD modulator 124. The SD modulator 124 can have other configurations without departing from the scope of the present disclosure.

The digital processor 126 has an input coupled to the output of the SD modulator 124. The output of the digital processor 126 corresponds to the output of the corresponding ADC channel 106. The digital processor 126 may condition or otherwise process the output of the SD modulator 124.

In FIG. 2A, the ADC channel 106a is a reference ADC channel or primary ADC channel. The ADC channels 106b and 106c are secondary ADC channels. As will be set forth in more detail below, the calibration process aligns the phase of each of the secondary ADC channels 106b and 106c with the phase of the reference ADC channel 106a.

The integrated circuit 102 includes a plurality of phase detection circuits 108. In particular, there is a phase detection circuit 108 for each secondary ADC channel 106. In the view of FIG. 102, a first phase detection circuit 108 is associated with the secondary ADC channel 106b. A phase detection circuit 108 is associated with the secondary ADC channel 106c. Each phase detection circuit 108 has a first input coupled to the output of the reference ADC channel 106a and a second input coupled to the output of the corresponding secondary ADC channel 106b or 106c. The phase detection circuits 108 of FIG. 2 are one example of a phase detector 108 of FIG. 1.

The integrated circuit 102 includes a chain of four buffers 132 coupled to the ADC channel 106a. The clock signal CLK is provided to the reference ADC channel 106a via the buffers 132.

The integrated circuit includes, for each secondary ADC channel, a respective clock phase adjustment circuit 110. The clock phase adjustment circuits 110 of FIG. 2A are one example of clock phase adjustment circuits 110 of FIG. 1. Each clock phase adjustment circuit includes a multiplexer 134 and a chain of buffers 132. The multiplexer 134 includes a control input coupled to the output of the phase detection circuit 108. The multiplexer 134 includes a plurality of inputs each coupled to the output of one of the buffers 132. The clock signal CLK is provided to a first buffer 132 of the chain of buffers of the clock phase adjustment circuit 110. The multiplexer outputs the adjusted clock signal CLKA.

During a calibration operation, the input test signal is provided to the input of each of the ADC channels 106 in parallel. Each ADC channel 106 generates an output test signal by processing the input test signal. The output test signal of the reference ADC channel 106a is a reference output test signal. The reference output test signal of the ADC channel 106a is provided to each of the derivative filters 120. The output test signal of each secondary ADC channel is provided to one of the phase detection circuits 108.

The phase detection circuit 108 generates a phase signal and outputs the phase signal to the control input of the corresponding multiplexer 134. The phase signal indicates the difference in phase between the reference output test signal and the corresponding secondary output test signal. In one embodiment, the phase detection circuit 108 calculates the derivative of reference test signal and the secondary clock signal and outputs a phase signal based on the difference in the derivatives.

In one embodiment, the output test signals are sine waves. The phase detection circuit 108 can identify the peak of the sine wave by determining when the derivative is zero. The phase detection circuit 108 can determine the phase difference by identifying the time difference between when the derivative of the reference output test signal zero and when the derivative of the secondary output test signal zero. This difference in time corresponds to the phase difference between the reference output test signal and the secondary output test signal. Identification of zero values of the derivatives is one possible way to determine timing/phase differences. However, the phase detection circuit 108 can use the derivative value for any other point in the sine wave. For example, in one embodiment the phase detector 108 can identify the zero crossing of the sine wave by determining when the derivative is maximum.

The phase detection circuit 108 outputs the phase signal to the multiplexer 134. The value of the phase signal causes the multiplexer 134 to select one of the inputs. In one embodiment, the default selection is input number 4 because this is the same amount of delay added by the chain of buffers 132 coupled to the primary ADC channel 106a. Depending on the value of the phase signal, the multiplexer 134 can reduce the delay in the clock signal by selecting one of the inputs 1, 2, or 3. The multiplexer 134 can increase the delay in the clock signal by selecting one of the inputs 5-8. Input 1 provides the smallest delay because the clock signal CLK is passed through only one buffer 132. Input 8 provides the largest delay because the clock signal CLK is passed through all eight buffers 132. The phase signal causes the multiplexer 134 to select the input that will result in a delay value in the clock signal CLK that causes the output of the secondary ADC channel 106b/c to be substantially in phase with the output of the reference or primary ADC channel 106a.

Figure 2B:
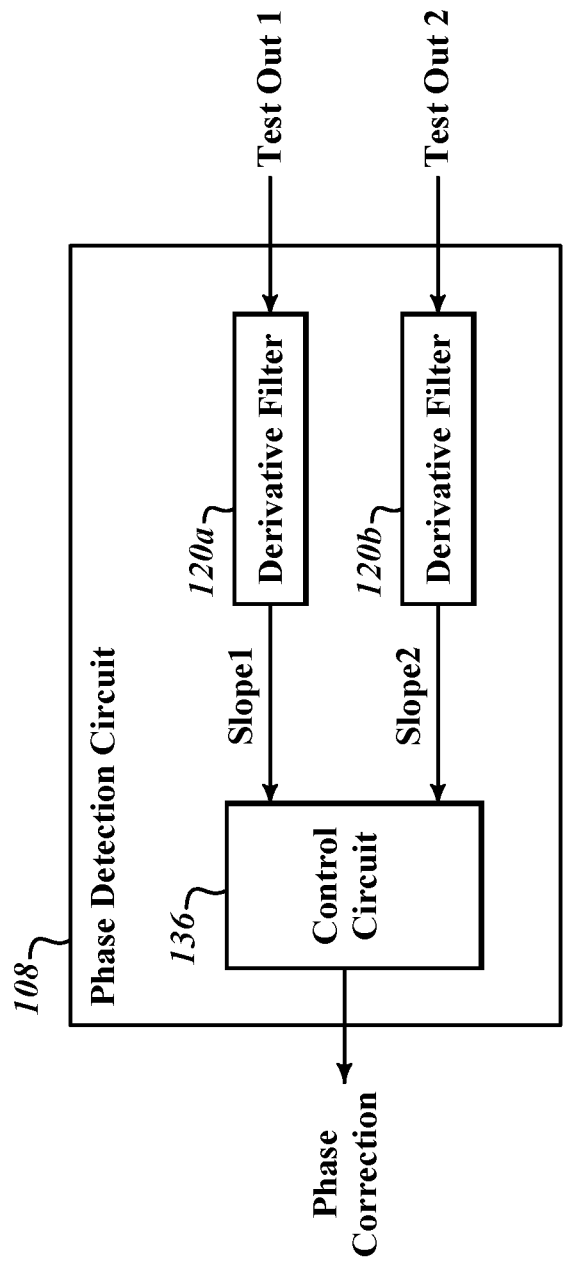
FIG. 2B is a block diagram of a phase detection circuit, according to one embodiment.

FIG. 2B is a block diagram of a phase detection circuit 108, according to one embodiment. The phase detection circuit 108 includes a derivative filter 120 and a control circuit 136. In practice, the derivative filter 120 may include a first derivative filter 120a and a second derivative filter 120b.

The derivative filter 120a receives the test output signal from the reference ADC channel 106a. The derivative filter 120a outputs a signal indicating the derivative or slope of the first test output signal. The derivative filter 120a may output a continuously changing signal whose value at any given time indicates the slope of the first test output signal.

The derivative filter 120b receives the test output signal from the secondary ADC channel 106b. The derivative filter 120b outputs a signal indicating the derivative or slope of the second test output signal. The derivative filter 120b may output a continuously changing signal whose value at any given time indicates the slope of the second test output signal. The phase detection circuit 108 may be described as having a single derivative filter 120 that outputs the slopes of both the first test output signal and the second test output signal.

The control circuit 136 receives the derivative signals from each of the derivative filters 120a and 102b. The control circuit 136 calculates the phase difference between the derivative filters 120a and 120b based on the derivative signals provided by the derivative filters 120a and 120b. The control circuit 136 outputs a phase signal or phase correction signal indicative of a phase difference between the first and second test output signals based on the derivatives of the first and second test output values.

In one embodiment, the control circuit 136 calculates the phase difference by detecting the difference in time between zero values of the first and second derivative signals. In one example, the first and second test output signals are sine waves. When the value of the derivative signal is zero, this corresponds to the peak of the sine wave. The control circuit 136 can detect the time difference between the peak of the first test output signal and the peak of the second test output signal. In particular, the control circuit 136 records the values of each of the derivative signals at each of a plurality of points in time. The control circuit can then determine the difference in the time between zero values of the derivatives of the two test output signals.

In one embodiment, the derivative signals may not reach a value of zero based on sampling times in the test output signals. Accordingly, the control circuit 136 may detect the minimum values of the derivative signals and may calculate the phase difference based on the time difference between minimum values in two derivative signals. The control circuit 136 can calculate the phase difference based on the derivative signals in other ways without departing from the scope of the present disclosure.

In one embodiment, the phase signal or phase correction signal is a control signal for the corresponding multiplexer 134. In particular, the phase correction signal is a signal that controls which input is selected by the multiplexer 134. The control circuit 136 can determine how much delay should be added or removed from the clock signal CLK based on the derivative signals. The control circuit 136 can then select the input of the multiplexer 134 based on the phase difference. The control circuit 136 generates the phase signal or phase correction signal indicating which of the inputs of the multiplexer 134 should be selected to be provided to the output of the multiplexer 134. In an example in which the multiplexer 134 has eight inputs, the phase signal may be a three-bit signal whose binary value corresponds to an input of the multiplexer 134. For example, the binary value 000 may correspond to input 1. The binary value 001 may correspond to input 2, and so forth. The phase signal may cause the multiplexer to select the corresponding input. Various other schemes can be utilized for a phase signal in order to cause a clock phase correction circuit to adjust the clock phase provided to an ADC channel 106, without departing from the scope of the present disclosure.

In one embodiment, the control circuit 136 aligns the phase of a secondary ADC channel with the primary ADC channel by reducing differences in the amplitudes of the corresponding test output signals. If both test output signals are sine waves, then a phase difference between the sine waves will correspond to a difference in the amplitude between the sine waves at any given moment. The control circuit 136 can generate the phase output signal to reduce the difference in amplitudes by aligning the phases of the first and second test output signals.

The phase detection circuit 108 including the derivative filter 120 and control circuit 136, in conjunction with the clock phase adjustment circuit 110, can make adjustments to the clock signals with a sensitivity much smaller than a period of the clock signals. Other solutions for phase alignment may only be able to align the phases within a single period of the clock cycle. Embodiments of the present disclosure can make phase adjustments with a resolution much smaller than a single clock cycle.

Figure 3:
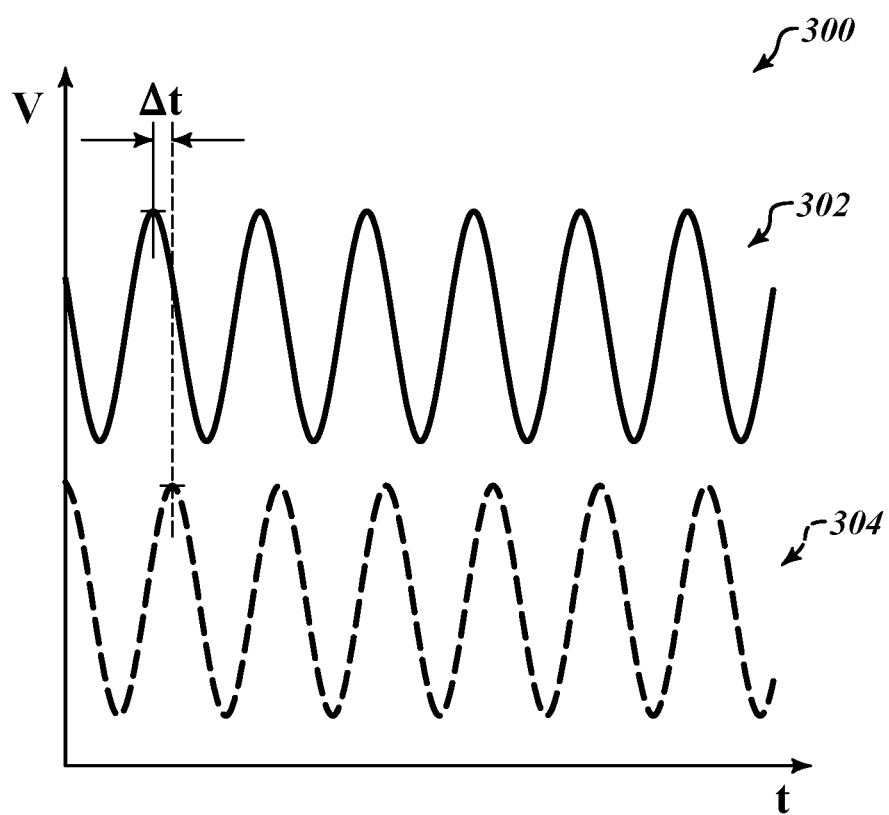
FIG. 3 is a graph illustrating output test signals of ADC channels, according to one embodiment.

FIG. 3 is a graph 300 of signals associated with calibration of ADC channels, in accordance with one embodiment. The curve 302 corresponds to the reference output test signal of the ADC channel 106a. The curve 304 corresponds to the secondary output test signal of the ADC channel 106b. The control circuit 136 identifies that the peak of the secondary test signal occurs with a delay ΔT relative to the peak of the reference output test signal, based on the output of the derivative filter 120. The control circuit 136 can output a phase signal indicative of this delay, or including a delay adjustment command based on the phase difference. The corresponding clock phase adjustment circuit 110 can then adjust the delay in the clock signal CLK provided to the corresponding secondary ADC channel 106b in order to align the phase of the secondary output test signal with the phase of the reference output test signal.

Figure 4A:
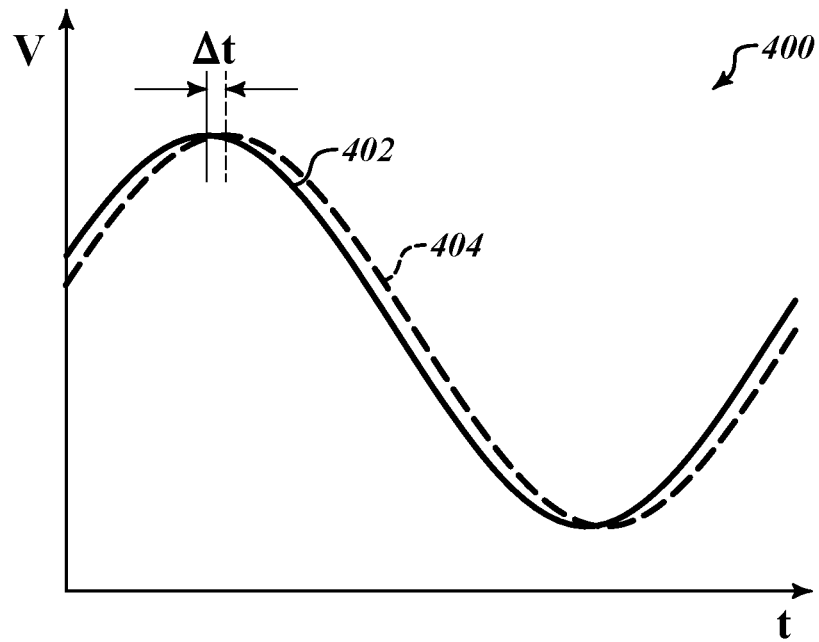
FIGS. 4A and 4B are graphs illustrating output test signals of ADC channels, according to one embodiment.

FIG. 4A illustrates a graph 400 of a reference output test 402 signal and the secondary output test signal 404 prior to calibration, in accordance with one embodiment. In FIG. 4A, there is a delay ΔT between the reference output test signal 402 and the secondary output test signal 404.

Figure 4B:
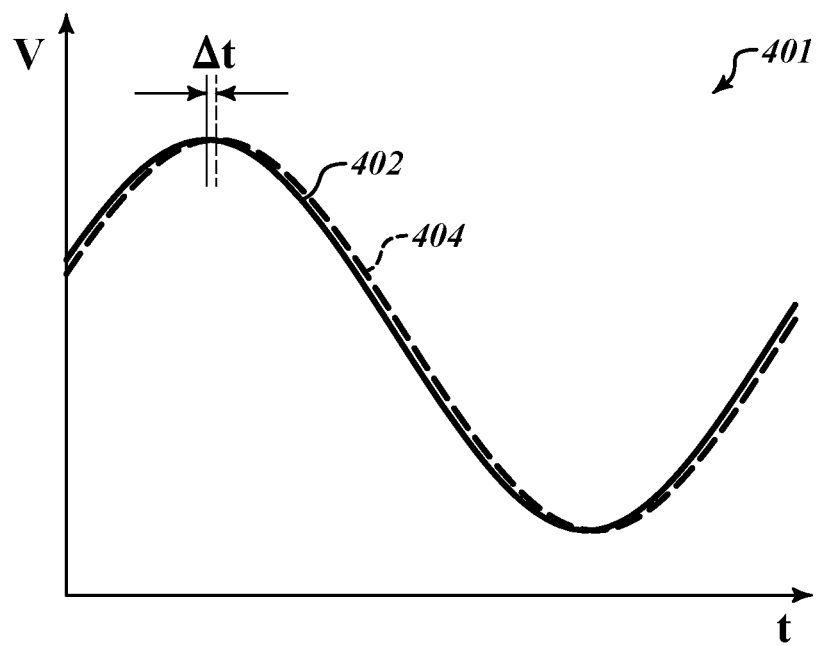

FIG. 4B illustrates a graph 41 of the reference output test signal 402 and the secondary output test signal 404 after calibration, in accordance with one embodiment. After calibration, there is a much smaller delay ΔT between the reference output test signal 402 and the secondary output test signal 404.

Figure 5:
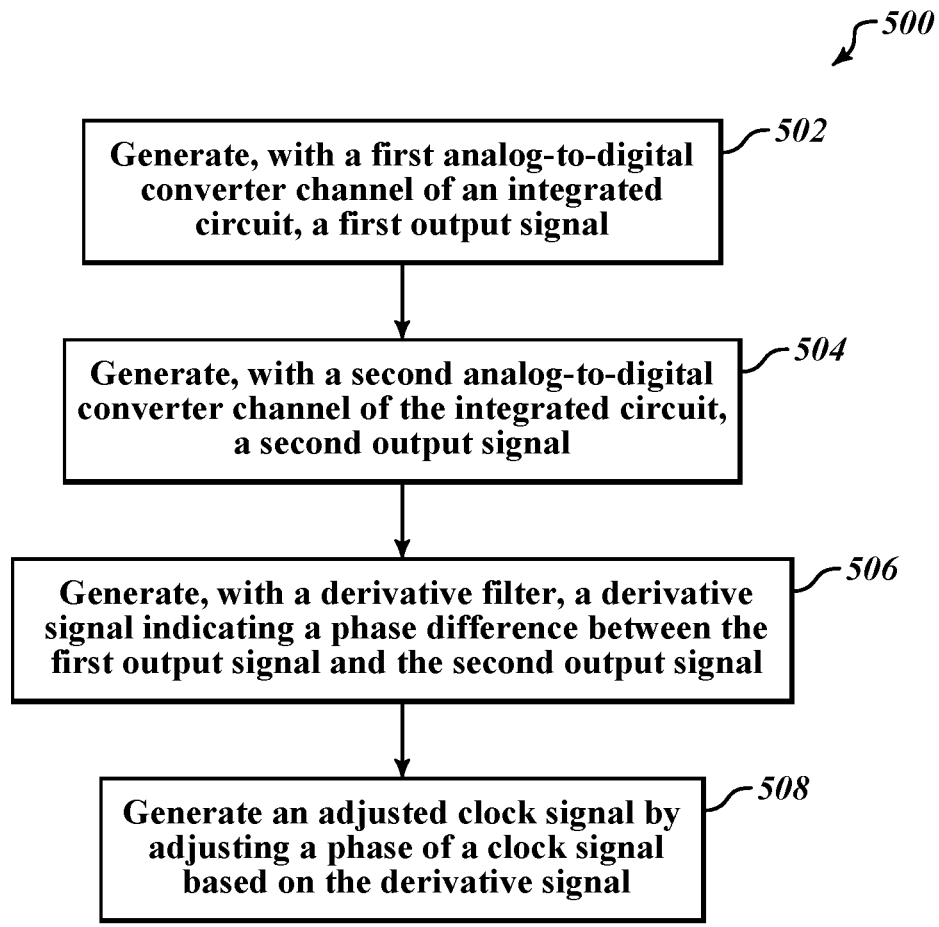
FIG. 5 is a flow diagram of a method for operating an integrated circuit, according to one embodiment.

FIG. 5 is a flow diagram of a method 500 for operating an integrated circuit, in accordance with one embodiment. The method 500 can utilize components, systems, and processes described in relation to FIGS. 1-4B. At 502, the method 500 includes generating, with a first analog-to-digital converter channel of an integrated circuit, a first output signal. At 504, the method 500 includes generating, with a second analog-to-digital converter channel of the integrated circuit, a second output signal. At 506, the method 500 includes generating, with a derivative filter, a derivative signal based on a phase difference between the first output signal and the second output signal. At 508, the method 500 includes generating an adjusted clock signal by adjusting a phase of a clock signal based on the derivative signal.

Figure 6:
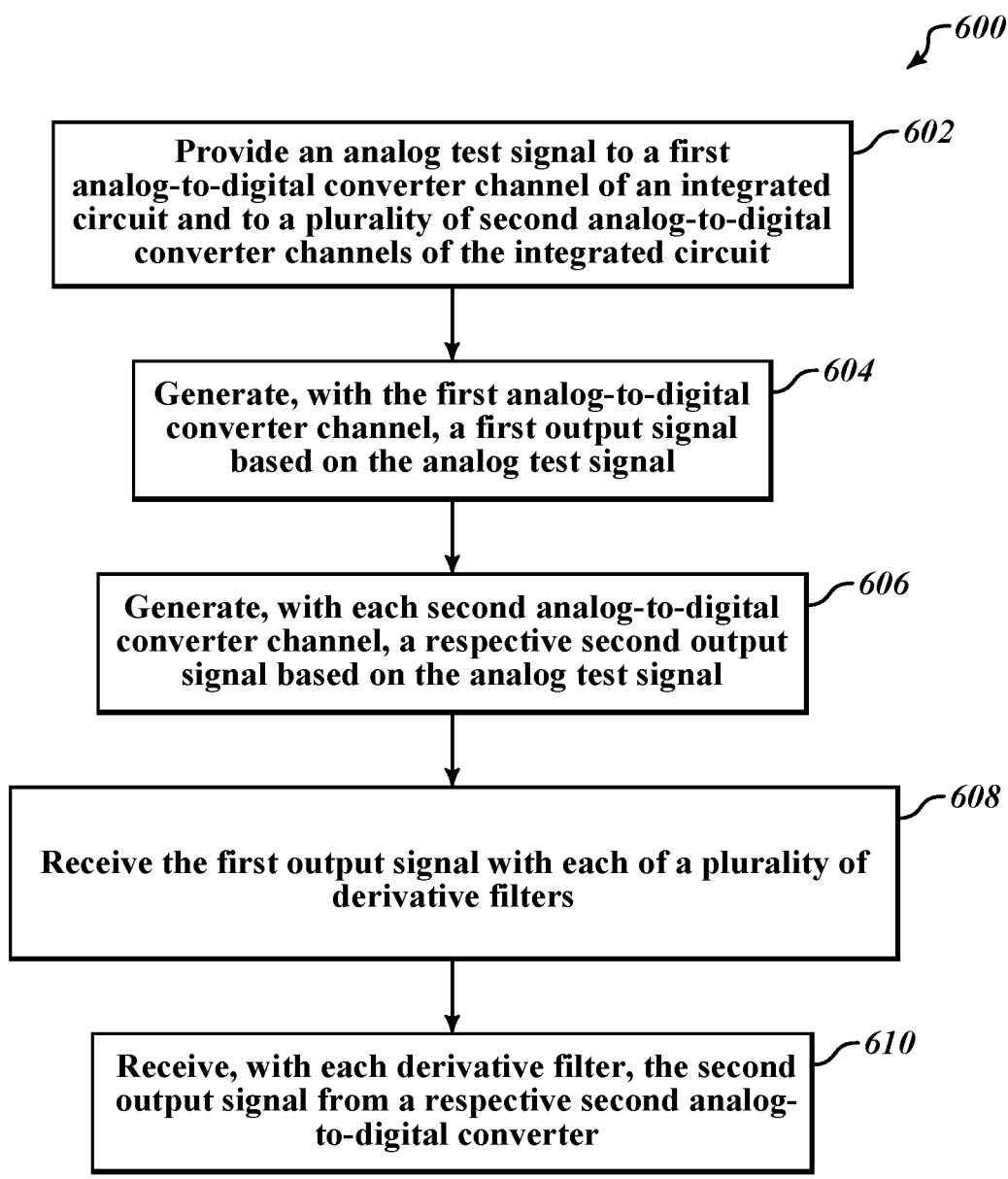
FIG. 6 is a flow diagram of a method for operating an integrated circuit, according to one embodiment.

FIG. 6 is a flow diagram of a method 600 for operating an integrated circuit, in accordance with one embodiment. The method 600 can utilize components, systems, and processes described in relation to FIGS. 1-5. At 602, the method 600 includes providing an analog test signal to a first analog-to-digital converter channel of an integrated circuit and to a plurality of second analog-to-digital converter channels of the integrated circuit. At 604, the method 600 includes generating, with the first analog-to-digital converter channel, a first output signal based on the analog test signal. At 606, the method 600 includes generating, with each second analog-to-digital converter channel, a respective second output signal based on the analog test signal. At 608, the method 600 includes receiving the first output signal with each of a plurality of derivative filters. At 610, the method 600 includes receiving, with each derivative filter, the second output signal from a respective second analog-to-digital converter.

In one embodiment, an integrated circuit includes a first analog-to-digital converter channel having an input and an output, a second analog-to-digital converter channel having an input and an output, and a derivative filter. The derivative filter includes a first input coupled to the output of the first analog-to-digital converter channel, a second input coupled to the output of the second analog-to-digital converter channel, an output.

In one embodiment, a method includes generating, with a first analog-to-digital converter channel of an integrated circuit, a first output signal and generating, with a second analog-to-digital converter channel of the integrated circuit, a second output signal. The method includes generating, with a derivative filter, a derivative signal based on a phase difference between the first output signal and the second output signal and generating an adjusted clock signal by adjusting a phase of a clock signal based on the derivative signal.

In one embodiment, a method includes providing an analog test signal to a first analog-to-digital converter channel of an integrated circuit and to a plurality of second analog-to-digital converter channels of the integrated circuit, generating, with the first analog-to-digital converter channel, a first output signal based on the analog test signal, and generating, with each second analog-to-digital converter channel, a respective second output signal based on the analog test signal. The method includes receiving, with a plurality of derivative filters each coupled to a respective second analog-to-digital converter channel of the plurality of second analog-to-digital converter channels, the first output signal and receiving, with each derivative filter, the second output signal of the second analog-to-digital converter coupled to the derivative filter.

In one embodiment, an integrated circuit includes a first analog-to-digital converter channel having an input and an output, a second analog-to-digital converter channel having an input and an output, and a third analog-to-digital converter channel having an input and an output. The integrated circuit includes a first derivative filter having a first input coupled to the output of the first analog-to-digital converter channel, a second input coupled to the output of the second analog-to-digital converter channel, and an output. The integrated circuit includes a second derivative filter having a first input coupled to the output of the first analog-to-digital converter channel, a second input coupled to the output of the third analog-to-digital converter channel, and an output.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An integrated circuit, comprising:
a first analog-to-digital converter channel having an input and an output;
a second analog-to-digital converter channel having an input and an output;
a phase detection circuit including:

a first input coupled to the output of the first analog-to-digital converter channel;

a second input coupled to the output of the second analog-to-digital converter channel;

an output;

a derivative filter coupled between the output and the first and second inputs, wherein the phase detection circuit is configured to determine a time difference between peaks in an output of the first analog-to-digital converter channel and an output of the second analog-to-digital channel based on the derivative filter; and a clock phase adjustment circuit configured to adjust a phase of a clock signal provided to the second analog-to-digital converter channel based on the time difference.

2. The integrated circuit of claim 1, wherein the clock phase adjustment circuit includes a control input coupled to the output of the phase detection circuit.

3. The integrated circuit of claim 2, wherein the clock phase adjustment circuit includes a clock input and a clock output, wherein the clock output of the clock phase adjustment circuit is coupled to a clock input of the second analog-to-digital converter channel.

4. The integrated circuit of claim 2, wherein the phase detection circuit includes a control circuit coupled to the derivative filter and configured to provide, on the output of the phase detection circuit, a phase signal based on an output of the derivative filter.

5. The integrated circuit of claim 4, wherein, during a calibration process of the second analog-to-digital converter, phase detection circuit is configured to:

receive, at the first input, a first output test signal from the output of the first analog-to-digital converter channel;

receive, at the second input, a second output test signal from the output of the second analog-to-digital converter channel;

generate, with the derivative filter, a derivative signal based on the derivative of either or both of the first and second output test signals;

generate, with the control circuit, a phase signal indicating a phase difference between the first output test signal and the second output test signal based the derivative signal; and output the phase signal from the output of the phase detection signal to the control input of the clock phase adjustment circuit.

6. The integrated circuit of claim 5, wherein the clock phase adjustment circuit is configured to:

receive a clock signal on the clock input terminal of the clock phase adjustment circuit;

to adjust the phase of the clock signal based on phase signal; and to output the adjusted clock signal from the clock output to the clock input of the second analog-to-digital converter channel.

7. The integrated circuit of claim 6, wherein the clock phase adjustment circuit includes:

a multiplexer having:

a control input corresponding to the control input of the clock phase adjustment circuit;

a plurality of inputs; and an output corresponding to the clock output of the clock phase adjustment circuit; and a first plurality of delay buffers coupled in series, wherein an input of a first delay buffer of the first plurality of delay buffers corresponds to the clock input of the clock phase adjustment circuit, wherein the output of each delay buffer of the first plurality of delay buffers is coupled to a respective input of the multiplexer.

8. The integrated circuit of claim 7, wherein the clock phase adjustment circuit includes a second plurality of delay buffers, wherein a first delay buffer of the second plurality of delay buffers connected in series and configured to receive the clock signal and to output the clock signal to a clock input of the first analog-to-digital converter channel.

9. The integrated circuit of claim 4, comprising a signal generator configured to apply a square wave to the input of the first analog-to-digital converter channel and to the input of the second analog-to-digital converter channel during calibration of the second analog-to-digital converter channel.

10. The integrated circuit of claim 4, wherein the first and second analog-to-digital converter channels are sigma delta analog-to-digital converter channels.

11. A method, comprising:

generating, with a first analog-to-digital converter channel of an integrated circuit, a first output signal;

generating, with a second analog-to-digital converter channel of the integrated circuit, a second output signal;

generating, with a derivative filter, a derivative signal indicating a phase difference between the first output signal and the second output signal;

determining, with a phase adjustment circuit, a time difference between peaks in an output of the first analog-to-digital converter channel and an output of the second analog-to-digital channel based on the derivative filter; and generating an adjusted clock signal by adjusting a phase of a clock signal provided to the second analog-to-digital converter channel based on the time difference.

12. The method of claim 11, comprising:

generating, with a phase detection circuit that includes the derivative filter, a phase signal based on the derivative signal;

receiving a clock signal at a clock input of a clock phase adjustment circuit;

receiving the phase signal with the clock phase adjustment circuit;

generating the adjusted clock signal with the clock phase adjustment circuit based on the phase signal; and providing the adjusted clock signal to a clock input terminal of the second analog-to-digital converter channel.

13. The method of claim 12, further comprising reducing a phase difference between the first output signal and the second output signal by generating the phase signal.

14. The method of claim 12, comprising adjusting a phase of the second output signal by generating the phase signal.

15. The method of claim 14, comprising providing an analog test signal to an input of the first analog-to-digital converter channel and to an input of the second analog-to-digital converter channel.

16. The method of claim 14, wherein the test signal is a square wave.

17. The method of claim 16, wherein the first output signal is a first digitized sine wave and the second output signal a second digitized sine wave.

18. A method, comprising:

providing an analog test signal to a first analog-to-digital converter channel of an integrated circuit and to a plurality of second analog-to-digital converter channels of the integrated circuit;

generating, with the first analog-to-digital converter channel, a first output signal based on the analog test signal;

generating, with each second analog-to-digital converter channel, a respective second output signal based on the analog test signal;

receiving the first output signal with each of a plurality of derivative filters;

receiving, with each derivative filter, the second output signal of a respective second analog-to-digital converter;

determining, with a phase adjustment circuit, a time difference between peaks in an output of the first analog-to-digital converter channel and an output of the second analog-to-digital channel based on at least one of the derivative filters; and generating an adjusted clock signal by adjusting a phase of a clock signal provided to the second analog-to-digital converter channel based on the time difference.

19. The method of claim 18, comprising generating, with a respective control circuit coupled to each derivative filter, a respective phase signal indicating a phase difference between the first output signal and the second output signal of the second analog-to-digital converter based on the derivative filter.

20. The method of claim 19, comprising:

receiving a clock signal at a plurality of clock phase adjustment circuits each coupled to a respective second analog-to-digital converter channel and to the control circuit coupled to the respective second analog-to-digital converter;

receiving, with each clock phase adjustment circuit, the phase signal of the control circuit coupled to the clock phase adjustment circuit;

generating, with each clock phase adjustment circuit, a respective adjusted clock signal by adjusting a phase of the clock signal based on the phase signal received by the clock phase adjustment circuit; and outputting, with each clock phase adjustment circuit, the adjusted clock signal to the second analog-to-digital converter channel coupled to the clock phase adjustment circuit.

* * * * *